United States Patent
Masaoka et al.

(10) Patent No.: US 9,748,018 B2
(45) Date of Patent: *Aug. 29, 2017

(54) DIELECTRIC COMPOSITION AND ELECTRONIC COMPONENT

(71) Applicant: TDK CORPORATION, Tokyo (JP)

(72) Inventors: Raitarou Masaoka, Tokyo (JP); Hiroki Uchiyama, Tokyo (JP); Shohei Fujii, Tokyo (JP); Maiko Shirokawa, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/192,293

(22) Filed: Jun. 24, 2016

(65) Prior Publication Data

US 2016/0379732 A1  Dec. 29, 2016

(30) Foreign Application Priority Data

Jun. 29, 2015 (JP) .............................. 2015-129686

(51) Int. Cl.
| | | |
|---|---|---|
| *C04B 35/495* | (2006.01) | |
| *H01B 3/10* | (2006.01) | |
| *H01B 3/12* | (2006.01) | |
| *C01G 35/00* | (2006.01) | |
| *H01G 4/33* | (2006.01) | |
| *H01G 4/12* | (2006.01) | |
| *H01G 4/10* | (2006.01) | |

(52) U.S. Cl.
CPC ............. *H01B 3/10* (2013.01); *C01G 35/006* (2013.01); *C04B 35/495* (2013.01); *H01B 3/12* (2013.01); *H01G 4/1254* (2013.01); *H01G 4/33* (2013.01); *C01P 2006/40* (2013.01); *H01G 4/10* (2013.01)

(58) Field of Classification Search
CPC ..................................................... C04B 35/495
See application file for complete search history.

(56) References Cited

U.S. PATENT DOCUMENTS 4,731,207 A * 3/1988 Matsumoto ............... H01P 7/10
  264/434
5,246,898 A * 9/1993 Fujimaru .............. C04B 35/495
  257/E23.009

(Continued)

FOREIGN PATENT DOCUMENTS

JP      61181008    *  8/1986
JP      H05-194017 A   8/1993

(Continued)

OTHER PUBLICATIONS

Chu, Ying-Hao, et al., "Properties of BA(MG1/3TA2/3)O3 Thin Films Prepared by Pulsed-Laser Deposition.", Jpn. J. Appl. Phys, vol. 42, pp. 7428-7431 (2003).

*Primary Examiner* — Karl Group
(74) *Attorney, Agent, or Firm* — Oliff PLC

(57) ABSTRACT

A dielectric composition containing a complex oxide represented by the formula of $xAO\text{-}yBO\text{-}zC_2O_5$ as the main component, wherein A represents at least one element selected from the group including Ba, Ca and Sr, B represents Mg, and C represents at least one element selected from the group including Nb and Ta, and x, y and z meet the following conditions, $x+y+z=1.000$, $0.198 \leq x \leq 0.375$, $0.389 \leq y \leq 0.625$, and $x/3 \leq z \leq x/3+1/9$.

4 Claims, 2 Drawing Sheets

(56) References Cited

U.S. PATENT DOCUMENTS

| | | |
|---|---|---|
| 2011/0226982 A1 | 9/2011 | Wada et al. |
| 2013/0150226 A1 | 6/2013 | Masaoka et al. |
| 2016/0115084 A1* | 4/2016 | Masaoka ................. C04B 35/01 501/135 |

FOREIGN PATENT DOCUMENTS

| | | | |
|---|---|---|---|
| JP | H08-319162 A | | 12/1996 |
| JP | 2012051738 | * | 3/2012 |
| JP | 2013-144631 A | | 7/2013 |
| JP | 2014141366 | * | 8/2014 |
| KR | 2011-0104441 A | | 9/2011 |

* cited by examiner

DIELECTRIC COMPOSITION AND ELECTRONIC COMPONENT

The present invention relates to a dielectric composition and an electronic component.

BACKGROUND

The MIMO (Multi-Input Multi-Output) technique which simultaneously utilizes a plurality of frequency bands has been put into use so as to provide a communication with a higher speed and a larger capacity in mobile communicating equipment which is represented by a smart phone or a tablet. Each frequency band needs a RF component. If the frequency bands for communication are increased in number, each component needs to be further downsized and provided with more functions to maintain the original size of the equipment where increased components are disposed.

Such an electronic component working at a high frequency can be, for example, a diplexer, a band-pass filter or the like. All of these components contain the combination of dielectric material(s) functioning as capacitor and magnetic material(s) functioning as inductor. In order to provide good high-frequency characteristics, each kinds of loss at a high-frequency region are required to be suppressed.

The requirements for the dielectric material are as follows. (1) According to the requirements for downsizing, the relative permittivity (Er) is required to be high in order to decrease the area of the capacitor. (2) The dielectric loss is required to be low, i.e., the Q value is required to be high in order to obtain a good selectivity in frequencies. (3) The temperature coefficient of static capacity (TCC) is required to be small.

For example, as the representative material having a low dielectric loss in the GHz band, the amorphous film of SiNx can be mentioned. However, its relative permittivity (Er) is as low as 6.5, so a large area is needed to provide the target functions. In this respect, it is difficult to meet the downsizing requirement.

In Patent Document 1, a technique involving $Ba(Mg_{1/3}Ta_{2/3})O_3$ which is a material with a low dielectric loss (i.e., a high Q value) has been disclosed. This kind of material is a condensed sintered compact obtained by a thermal treatment at a temperature of 1500° C. or higher, and its relative permittivity (Er) at 10 GHz is 24.7 and the Q value is 51000. In addition, it has been disclosed in Non-Patent Document 1 that $Ba(Mg_{1/3}Ta_{2/3})O_3$ is subjected to depositing film by the PLD method (Pulsed Laser Deposition) and then crystallized via a thermal treatment at 600° C. so as to provide a relative permittivity (∈r) of 33.3 at 2.66 GHz and a tan δ of 0.0158 (the value is 63.3 when calculated in terms of Q value).

Non-Patent Document
Non-Patent Document 1: Jpn. J. Appl. Phys. vol. 42(2003) pp. 7428-7431 "Properties of $Ba(Mg_{1/3}Ta_{2/3})O_3$ Thin Films Prepared by Pulsed-Laser Deposition"
Patent Document
Patent Document 1: JP-A-H8-319162

SUMMARY

However, the technique in Patent Document 1 is about a sintered compact. Besides, sufficient volume is required in order to achieve the dielectric properties, thus, it will be much too large in size if the material is to be used in the small electronic component working at a high frequency. On the other hand, it can be known that if $Ba(Mg_{1/3}Ta_{2/3})O_3$ in Patent Document 1 is prepared as a film to downsize the component, such a high Q value will be hardly obtained as that in the conventional sintered compact. Further, as for the technique in Non-Patent Document 1, although a relative permittivity (∈r) of 33.3 and a Q value of 63.3 can be obtained when the material is formed as a film, a higher Q value is expected for the electronic component working at a high frequency.

In addition, in Patent Document 1 and Non-Patent Document 1, anything about the temperature coefficient of static capacity is not mentioned, which is an important property desired in a dielectric material working at a high frequency.

The present invention has been completed in view of the actual conditions mentioned above. The present invention aims to provide a dielectric composition with a high relative permittivity, a low dielectric loss (i.e., a high Q value), and a small temperature coefficient of static capacity even when used in a downsized component and also an electronic component using the dielectric composition.

In order to achieve the mentioned aim, the dielectric composition according to the present invention is characterized in that it comprises a complex oxide represented by the formula of $xAO\text{-}yBO\text{-}zC_2O_5$ (wherein A represents at least one element selected from the group consisting of Ba, Ca and Sr, B represents Mg, and C represents at least one element selected from the group consisting of Nb and Ta) as the main component, wherein x, y and z meet the following conditions, $x+y+z=1.000$, $0.198 \le x \le 0.375$, $0.389 \le y \le 0.625$ and $x/3 \le z \le x/3 + 1/9$.

When x, y and z fall within the mentioned ranges, a dielectric composition can be obtained with a high relative permittivity, a high Q value and further a small temperature coefficient of static capacity.

Further, compared to the use of a conventional dielectric composition in an electronic component working at a high frequency, the use of the dielectric composition of the present invention provides an electronic component such as a dielectric resonator or a dielectric filter with a sufficiently high relative permittivity, a high Q value (i.e., a high SIN ratio), and a small temperature coefficient of static capacity even when the component is downsized.

The present invention is capable of providing a dielectric composition having a high relative permittivity, a low dielectric loss (i.e., a high Q value) and a small temperature coefficient of static capacity even when it is downsized. Also, an electronic component using the dielectric composition can be provided in the present invention.

DETAILED DESCRIPTION OF EMBODIMENTS

Figure 1:
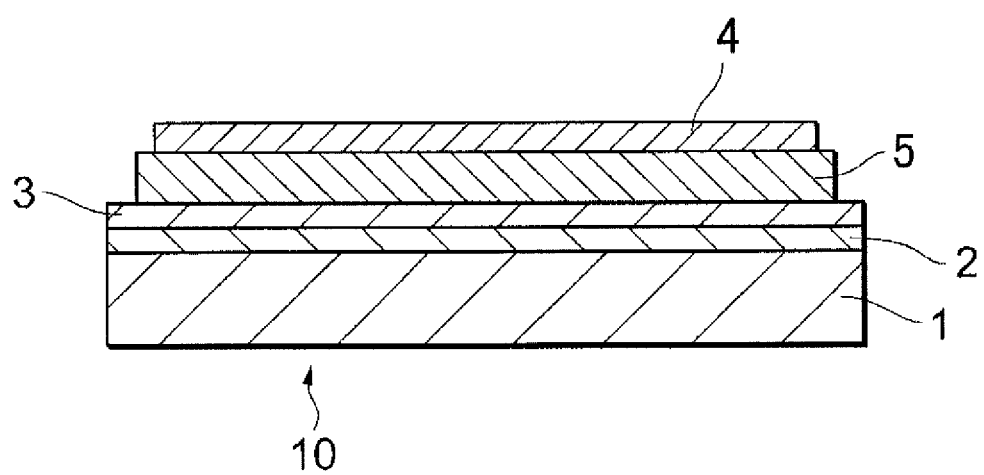
FIG. 1 is a cross-sectional view of a film capacitor in one embodiment of the present invention.

Hereinafter, the preferable embodiments of the present invention will be described with reference to the drawings based on different cases.
(Film Capacitor 10)
FIG. 1 is a cross-sectional view of film capacitor 10 as an example of the electronic component using the dielectric composition in one embodiment of the present invention.

Film capacitor 10 is provided with lower electrode 3, upper electrode 4 and dielectric film 5 disposed between lower electrode 3 and upper electrode 4, which three are laminated on the surface of supporting substrate 1. Foundation layer 2 is provided between supporting substrate 1 and lower electrode 3 to enhance the adhesion between them. Supporting substrate 1 guarantees the whole mechanical strength of film capacitor 10.

The shape of the film capacitor is not particularly restricted and is usually cuboid. Further, its size is not particularly restricted. The thickness or the length can be appropriately set in accordance with specific uses.

(Supporting Substrate 1)

There is no particular restriction on the material for forming supporting substrate 1 as shown in FIG. 1. For example, single crystals such as single crystalline Si, single crystalline SiGe, single crystalline GaAs, single crystalline InP, single crystalline $SrTiO_3$, single crystalline MgO, single crystalline $LaAlO_3$, single crystalline $ZrO_2$, single crystalline $MgAl_2O_4$ and single crystalline $NdGaO_3$, or ceramic polycrystalline substrates such as polycrystalline $Al_2O_3$, polycrystalline ZnO and polycrystalline $SiO_2$, or substrate of metals such as Ni, Cu, Ti, W, Mo, Al, Pt or the like or the alloys thereof can form supporting substrate 1, but there is no particular restriction. Among these materials, the single crystalline Si is usually used as the substrate from the viewpoint of the low cost and good processabilities. The resistivity of supporting substrate 1 varies depending on the material of the substrate. When a material having a low resistivity is used as the substrate, the leakage of the current flowing towards the substrate side will affect the electric properties of film capacitor 10 if such a substrate is directly used. Thus, sometimes an insulating treatment can be performed on the surface of supporting substrate 1 so as to prevent the current in use from flowing to supporting substrate 1. For example, when single crystalline Si is used as supporting substrate 1, the surface of supporting substrate 1 can be oxidized to form an insulating layer of $SiO_2$, Alternatively, insulating materials such as $Al_2O_3$, $SiO_2$, $Si_3N_x$ or the like can be formed on the surface of supporting substrate 1. The material for the insulating layer or the film thickness is not restricted as long as supporting substrate 1 can be kept insulated. However, the film thickness is preferred to be 0.01 um or more. A thickness less than 0.01 μm cannot ensure the insulation and thus is not preferred as the thickness of the insulating layer. There is no particular restriction on the thickness of supporting substrate 1 as long as the whole mechanical strength of the film capacitor can be ensured. For example, the thickness can be set to be 10 μm to 5000 μm. When the thickness is thinner than 10 μm, the mechanical strength may not be ensured. On the other hand, if the thickness is thicker than 5000 μm, a problem may be caused that it cannot contribute to the downsizing of the electronic component.

(Foundation Layer 2)

In the present embodiment, film capacitor 10 shown in FIG. 1 preferably has foundation layer 2 on the surface of supporting substrate 1 which has been provided with an insulating treatment. Foundation layer 2 is inserted in order to enhance the adhesion between supporting substrate 1 and lower electrode 3. As an example, Cr is usually inserted as foundation layer 2 when Cu is used in lower electrode 3 and Ti is usually inserted as foundation layer 2 when Pt is used as lower electrode 3.

Foundation layer 2 is not restricted to these materials because the purpose is to improve the adhesion. In addition, foundation layer 2 can be omitted if the adhesion between supporting substrate 1 and lower electrode 3 can be guaranteed.

(Lower Electrode 3)

The material for forming lower electrode 3 is not particularly restricted as long as it is conductive. For instance, lower electrode 3 can be formed by metals such as Pt, Ru, Rh, Pd, Ir, Au, Ag, Cu, Ni and the like or the alloys thereof or the conductive oxides thereof. In this respect, the material can be selected in accordance with the cost or the atmosphere during the thermal treatment for the dielectric layer 4. In addition to air, the thermal treatment for the dielectric layer 4 can also be carried out in an inert gas such as $N_2$ or Ar or a mixed gas of an inert gas and an oxidative gas $O_2$, or a mixed gas of an inert gas and a reductive gas $H_2$. The film thickness of lower electrode 3 is not particularly restricted as long as lower electrode 3 can function as an electrode. Further, the thickness is preferred to be 0.01 μm or more. A thickness of less than 0.01 μm is not preferable because the conductivity will be deteriorated in that case. In addition, when a substrate composed of Cu, Ni, Pt or the like or a conductive oxide material (all of which can be used as an electrode) is used as supporting substrate 1, foundation layer 2 and lower electrode 3 mentioned above can be omitted, wherein, Cu, Ni, Pt or the like or a conductive oxide material can be used as an electrode.

A thermal treatment can be provided after the formation of lower electrode 3 so as to improve the adhesion between foundation layer 2 and lower electrode 3 and also to improve the stability of lower electrode 3. When the thermal treatment is performed, the heating rate is preferably 10° C./min to 2000° C./min, and more preferably 100° C./min to 1000° C./min. The holding temperature during the thermal treatment is preferably 400° C. to 800° C., and the holding time is preferred to be 0.1 hour to 4.0 hours. If any parameter goes beyond the ranges mentioned above, the adhesion will not be good and the surface of the lower electrode 3 will be uneven so that the dielectric properties of dielectric film 5 is likely to deteriorate.

(Dielectric Film 5)

The dielectric composition for forming dielectric film 5 comprises a complex oxide represented by the formula of $xAO-yBO-zC_2O_5$ (A represents at least one element selected from the group consisting of Ba, Ca and Sr, B represents Mg, and C represents at least one element selected from the group consisting of Nb and Ta) as the main component.

Further, when the main component of the dielectric composition is represented as $xAO-yBO-zC_2O_5$, x, y and z will meet the following conditions. That is, $x+y+z=1.000$, $0.198 \leq x \leq 0.375$, $0.389 \leq y \leq 0.625$ and $x/3 \leq z \leq x/3+1/9$.

The inventors of the present invention consider the main reason for achieving the effects of maintaining the high relative permittivity together with improving the temperature performance is as follows. In general, it is known that $A^{2+}(B'^{2+}_{1/3}B''^{5+}_{2/3})O_3$ with a superlattice structure has a high Q value due to the long range order of B site. However, when the component is downsized to an extend that the ratio of the surface relative to the volume cannot be neglected, a conventional crystalline structure cannot be maintained and deficiencies of the B' site are likely to be caused and the long range order of B site cannot be maintained. As a result, the Q value tends to decrease. If $Mg^{2+}$ which is the ion of B' site is excessive, the B' site may be prevented from missing. Thus, the long range order ($B_{1/3}$-$C_{2/3}$) of B site can be easily maintained and the Q value will be higher.

In addition, $A^{2+}(B'^{2+}_{1/3}B''^{5+}_{2/3})O_3$ with a superlattice structure has a temperature coefficient of static capacity of about −30 ppm/K to −80 ppm/K while the MgO has a positive temperature coefficient of static capacity of +100 ppm/K or more. It is considered that the temperature coefficients of static capacity can be offset and the temperature performance can be improved by mixing and using the above materials.

When x is more than 0.375, no sufficient Q value can be obtained. If y exceeds 0.625, sufficient relative permittivity cannot be achieved and the amount of MgO whose temperature coefficient of static capacity is positive becomes excessive, and thus the temperature coefficient of static capacity will become large. If z is higher than x/3+1/9, the excessive $Ta_2O_5$ will easily produce the oxygen vacancy and turn the composition semi-conductive. Also, the dielectric loss tends to increase, i.e., the Q value tends to decrease. When z is less than x/3, the excessive BaO will react with $CO_2$ or $H_2O$ in the atmosphere so that the dielectric composition will be changed and it is likely that the shape cannot be maintained. A high relative permittivity, a high Q value and a small temperature coefficient of static capacity can be provided by setting x, y and z in following ranges, i.e., x+y+z=1.000, 0.198≤x≤0.375, 0.389≤y≤0.625 and x/3≤z≤x/3+1/9.

Further, in the formula mentioned above, x, y and z preferably meet the following conditions, i.e., x+y+z=1.000, 0.240≤x≤0.328, 0.534≤y≤0.625 and 0.094≤z≤0.158.

When x, y and z fall within the ranges mentioned above, the temperature coefficient of static capacity can be maintained within the range of −60 ppm/K to +60 ppm/K and the long range order of B site can be maintained. Thus, the effect of maintaining a small temperature coefficient of static capacity and a higher Q value can be achieved.

A represents at least one element selected from the group consisting of Ba, Ca and Sr. The same effect will be produced no matter only one or several elements from Ba, Ca and Sr are used. In addition, B represents Mg, and C represents at least one element selected from the group consisting of Nb and Ta. With respect to C, the same effect will be produced no matter only one or several elements from Nb and Ta are used.

The thickness of the dielectric film 5 is preferably 10 nm to 2000 nm, and more preferably 50 nm to 1000 nm. If the thickness is less than 10 nm, the dielectric breakdown is likely to happen. When the thickness exceeds 2000 nm, the area of the electrode needs to be broadened so as to enlarge the electrostatic capacity of the capacitor, and it may be hard to downsize depending on the designs of the electronic component. In the measurement of the thickness of the dielectric film, the dielectric film can be milled by a processing device involving FIB (focused ion beam), and then the obtained cross-section is observed through an SIM (Scanning ion microscope) to measure the thickness.

Dielectric film 5 is preferably formed by various film-depositing methods such as vacuum evaporation, sputtering, PLD, MO-CVD (Metal-organic chemical vapor deposition), MOD (Metal organic decomposition) or Sol-Gel, CSD (Chemical solution deposition) or the like. At that time, a trace of impurities or subcomponents may be contained in the starting material in use (i.e., the deposition material, various target materials, organometalic material and etc.), but no particular problem will arise as long as they are not impurities which will significantly deteriorate the insulation properties.

Further, a trace of impurities or subcomponents may be contained in the dielectric composition as long as they are not matters which will significantly deteriorate the dielectric properties (i.e., the relative permittivity, the Q value, or the temperature coefficient of static capacity). Thus, the amount of the main component as the balance is not particularly restricted. For example, the amount of the main component is 50 mol % or more and 100 mol % or less relative to the whole dielectric composition comprising the main component.

In addition, dielectric film 5 is usually only composed of the dielectric composition of the present invention, but it can also be a laminated structure in combination with films made of other dielectric compositions. For example, by making into a laminated structure with the conventional amorphous dielectric films or the crystalline films such as $Si_3N_x$, $SiO_x$, $Al_2O$—, $ZrO_x$, $Ta_2O_x$ or the like, the impedance of the dielectric film 5 or the temperature coefficient of static capacity can be adjusted.

(Upper Electrode 4)

In one example of the present embodiment, film capacitor 10 is provided with upper electrode 4 on the surface of dielectric film 5, wherein upper electrode 4 functions as another electrode in film capacitor 10. The material for forming upper electrode 4 is not particularly restricted as long as it is conductive. Upper electrode 4 can be formed by the same material as that for lower electrode 3. Also, the thickness of upper electrode 4 is not particularly restricted as long as the function as an electrode can be exerted, and the thickness is preferred to be 10 nm or more. A film thickness of 10 nm or less is not preferable for upper electrode 4 because the conductivity will deteriorate in that case.

In the embodiment mentioned above, a film capacitor is presented as an example of the electronic component using the dielectric composition according to one embodiment of the present invention. However, the electronic component using the dielectric composition of the present invention is not limited to the film capacitor and also can be any electronic component having a dielectric film such as a diplexer, a band-pass filter, a balun or a coupler.

EXAMPLES

Hereinafter, the present invention will be further described based on detailed examples, but the present invention is not limited to these examples.

Example 1

Comparative Example 1

First of all, a Ti film as the foundation layer with a thickness of 20 nm was deposited by a sputtering method on the surface of a square substrate of 10 mm×10 mm with a thickness of 350 μm, wherein the square substrate included a $SiO_2$ insulating film with a thickness of 6 μM on the surface of Si.

Next, a Pt film as the lower electrode with a thickness of 100 nm was deposited by sputtering method on the deposited Ti film mentioned above.

The formed Ti/Pt film was subjected to a thermal treatment at the ordinary pressure under oxygen atmosphere with a heating rate of 400° C./min and a holding temperature of 700° C. for 30 minutes.

The PLD method was used in the formation of the dielectric film. The targets necessary in the formation of the dielectric film were prepared as follow.

First, MgO and $Ta_2O_5$ were weighed to get the amounts of Mg and Ta in Sample No. 1 to Sample No. 18 as shown in Table 1. The weighed starting powders together with water and $ZrO_2$ beads of φ2 mm were put into a wide-mouth poly-pot of 1 L and then subjected to wet mixing for 20 hours. Then, the slurry of the mixed powder was dried at 100° C. for 20 hours. The obtained mixed powder was put into a crucible made of $Al_2O_3$ and the first calcination was performed in air at 1250° C. for 5 hours to provide the $MgO$—$Ta_2O_5$ calcined powder.

Thereafter, the obtained $MgO$—$Ta_2O_5$ calcined powder and $BaCO_3$ were weighed to get the z values of Sample No. 1 to Sample No. 18 as shown in Table 1. The weighed starting powders together with water and $ZrO_2$ beads of φ2 mm were put into a wide-mouth poly-pot of 1 L and then subjected to wet mixing for 20 hours. Then, the slurry of the mixed powder was dried at 100° C. for 20 hours. The obtained mixed powder was put into a crucible made of $Al_2O_3$ and the second calcination was performed in air at 1050° C. for 5 hours to provide the $BaO$—$MgO$—$Ta_2O_5$ calcined powder.

The $BaO$—$Ta_2O_5$ based compound without Mg inhibited the generation of the target product of $BaO$—$MgO$—$Ta_2O_5$. However, with such calcination in two steps, $BaO$—$Ta_2O_5$ based compound was prevented from generating.

The resultant calcined powder was put into a mortar, and an aqueous solution of PVA (i.e., polyvinyl alcohol) with a concentration of 6 wt % was added as a binder in an amount of 4 wt % relative to the calcined powder. A pestle was used to prepare granulated powder, and then the granulated powder was added into a mold of φ20 mm to provide a thickness of about 5 mm. Then, a molded body was obtained by using a uniaxial pressing machine at room temperature under a pressure of $2.0 \times 10^8$ Pa.

After that, a de-binder treatment was provided to the resultant molded body under atmospheric air with a heating rate of 100° C./hour and a holding temperature of 400° C. for 4 hours. Then, a sintering process was performed under atmospheric air with a heating rate of 200° C./hour and a holding temperature of 1600° C. to 1700° C. for 12 hours.

Next, the obtained sintered compact was grinded by using a cylindrical grinding machine on both surfaces until its thickness became 4 mm, so the target for PLD necessary in the deposition of the dielectric film was prepared.

Thus prepared target for PLD was used in the PLD method to form a dielectric film with a thickness of 400 nm on the lower electrode. During the film-depositing using the PLD method, the oxygen pressure was controlled to be $1 \times 10^{-1}$ Pa and the substrate was heated to 200° C. In addition, in order to expose part of the lower electrode, a metal mask was used to form an area where no dielectric film was deposited. The dielectric film was provided with an annealing treatment at 600° C. in the $O_2$ atmosphere for 1 hour.

In the measurement of the thickness of the dielectric film, the dielectric film was milled by FIB and then the resultant cross-section was observed by SIM to measure the thickness.

After film-depositing, the composition of the dielectric film was analyzed in all samples by the following method. It had been confirmed that the composition was identical to that described in Table 1.

(Composition Analysis)

The composition analysis was carried out by using a wavelength dispersive X-ray fluorescence spectrometry (using ZSX-100e produced by Rigaku Corporation) at the room temperature.

Thereafter, a vapor deposition apparatus was used to deposit an Ag film as the upper electrode on the obtained dielectric film. The shape of the upper electrode was formed using a metal mask to have a diameter of 100 μm and a thickness of 100 nm, providing Sample No. 1 to Sample No. 18 with the structure shown in FIG. 1.

As for all the obtained film capacitor samples, the relative permittivity, the Q value and the temperature coefficient of static capacity were respectively measured through the following methods.

(Relative Permittivity ($\in$r) and Q Value)

The relative permittivity ($\in$r) and the Q value (no unit for both) of the film capacitor samples were calculated based on the results from the measurement of the electrostatic capacity and film thickness under a frequency of 2 GHz and an input signal level (measuring voltage) of 0.5 Vrms at a reference temperature of 25° C. using an RF impedance/material analyzer (4991A produced by Agilent Technologies). It was preferred to have a higher relative permittivity. A relative permittivity of 20 or more was deemed as a good result. Further, the Q value was preferred to be higher and a value of 600 or more was deemed as a good result.

(Temperature Coefficient of Static Capacity (TCC))

As for the temperature coefficient of static capacity, the electrostatic capacity was measured by the same method as that for the relative permittivity except that the measuring temperature was changed by using a constant-temperature bath from −55° C. to 125° C. with an interval of 25° C. The coefficient (whose unit was ppm/K) was calculated relative to the reference temperature of 25° C. In addition, the temperature coefficient of static capacity was preferred to be small, and a value within the range of −60 ppm/K to +60 ppm/K was deemed as a good result.

TABLE 1

| | Sample No. | AO | | | BO | $C_2O_5$ | | Relative permittivity (—) | Q value (—) | TCC (ppm/K) |
|---|---|---|---|---|---|---|---|---|---|---|
| | | Ba | Ca | Sr | Mg | Nb | Ta | | | |
| | | | x | | y | z | | | | |
| Example 1 | 1 | 0.375 | 0.000 | 0.000 | 0.500 | 0.000 | 0.125 | 24 | 687 | +17 |
| | 2 | 0.328 | 0.000 | 0.000 | 0.562 | 0.000 | 0.109 | 22 | 768 | +41 |
| | 3 | 0.281 | 0.000 | 0.000 | 0.625 | 0.000 | 0.094 | 20 | 870 | +51 |
| | 4 | 0.240 | 0.000 | 0.000 | 0.625 | 0.000 | 0.135 | 21 | 748 | +53 |
| | 5 | 0.198 | 0.000 | 0.000 | 0.625 | 0.000 | 0.177 | 21 | 653 | +56 |
| | 6 | 0.287 | 0.000 | 0.000 | 0.507 | 0.000 | 0.207 | 23 | 673 | +37 |
| | 7 | 0.375 | 0.000 | 0.000 | 0.389 | 0.000 | 0.236 | 25 | 699 | +14 |
| | 8 | 0.375 | 0.000 | 0.000 | 0.444 | 0.000 | 0.181 | 24 | 689 | +15 |
| | 9 | 0.308 | 0.000 | 0.000 | 0.534 | 0.000 | 0.158 | 23 | 723 | +33 |
| Comparative Example 1 | 10 | 0.433 | 0.000 | 0.000 | 0.423 | 0.000 | 0.144 | 27 | 598 | +9 |
| | 11 | 0.375 | 0.000 | 0.000 | 0.556 | 0.000 | 0.070 | Immeasurable | | |
| | 12 | 0.318 | 0.000 | 0.000 | 0.625 | 0.000 | 0.058 | Immeasurable | | |
| | 13 | 0.238 | 0.000 | 0.000 | 0.682 | 0.000 | 0.079 | 18 | 957 | +63 |
| | 14 | 0.155 | 0.000 | 0.000 | 0.682 | 0.000 | 0.163 | 17 | 799 | +68 |
| | 15 | 0.162 | 0.000 | 0.000 | 0.625 | 0.000 | 0.213 | 19 | 651 | +65 |
| | 16 | 0.269 | 0.000 | 0.000 | 0.483 | 0.000 | 0.249 | 23 | 438 | +41 |
| | 17 | 0.375 | 0.000 | 0.000 | 0.340 | 0.000 | 0.284 | 27 | 483 | +16 |
| | 18 | 0.433 | 0.000 | 0.000 | 0.312 | 0.000 | 0.255 | 28 | 568 | +11 |

Sample No. 1 to Sample No. 9

Figure 2:
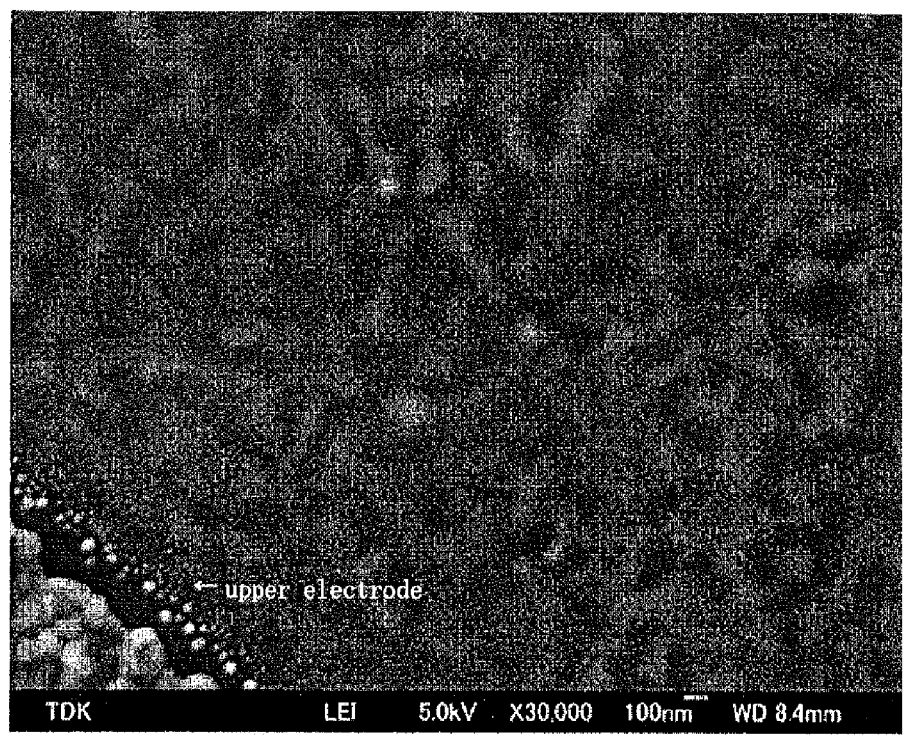
FIG. 2 is a picture taken by an SEM (i.e., scanning electron microscope) showing the surface of the dielectric composition (Example 1) in one embodiment of the present invention where the dielectric composition is film-deposited by heating the substrate to 200° C.

Similar to the sample shown in FIG. 2, no defect such as crack was found on the surface in Sample No. 1 to Sample No. 9. According to Table 1, it was confirmed that Sample No. 1 to Sample No. 9 were dielectric compositions with $BaO-MgO-Ta_2O_5$ as the main component where the main component of the dielectric composition was represented by $xBaO\text{-}yMgO\text{-}zTa_2O_5$ and x, y and z met the conditions $x+y+z=1.000$, $0.198 \le x \le 0.375$, $0.389 \le y \le 0.625$ and $x/3 \le z \le x/3+1/9$, and the samples had a relative permittivity of 20 or more, a Q value of 600 or more and a temperature coefficient of static capacity of −60 ppm/K to +60 ppm/K.

Sample No. 2 to Sample No. 4, and Sample No. 9

According to Table 1, it was confirmed that Sample No. 2 to Sample No. 4 and Sample No. 9 where the main component of the dielectric film was represented by $xBaO\text{-}yMgO\text{-}zTa_2O_5$ and x, y and z met the conditions $x+y+z=1.000$, $0.240 \le x \le 0.328$, $0.534 \le y \le 0.625$ and $0.094 \le z \le 0.158$ had a relative permittivity of 20 or more and a Q value of 700 or more and a temperature coefficient of static capacity of −60 ppm/K to +60 ppm/K.

Sample No. 10 to Sample No. 18

The dielectric properties of Sample No. 11 and Sample No. 12 with $x/3 > z$ could not be evaluated due to crack. Similar to the sample shown in FIG. 2, no defect such as crack was found on the surface in Sample No. 10, Sample No. 13 to Sample No. 18. Sample No. 13 and Sample No. 14 with $y > 0.625$ had a relative permittivity of lower than 20. Sample No. 10 with $x > 0.375$ as well as Sample No. 16 and Sample No. 17 with $z > x/3+1/9$ had a Q value of less than 600. In addition, the temperature coefficient of static capacity of Sample No. 13 to Sample No. 15 was not in the range of −60 ppm/K to +60 ppm/K.

Example 2

$BaCO_3$, $CaCO_3$, $SrCO_3$, MgO and $Ta_2O_5$ were weighed to obtain the amounts of Ba, Ca, Sr, Mg and Ta listed in Table 2. A calcined powder of $MgO-Ta_2O_5$ was obtained in the first calcination. Calcined powders of $CaO-MgO-Ta_2O_5$ (in Sample No. 19), $SrO-MgO'-Ta_2O_5$ (in Sample No. 20), $(Ba-Ca)O-MgO-Ta_2O_5$ (in Sample No. 21), $(Ca-Sr)O-MgO-Ta_2O_5$ (in Sample No. 22), $(Sr-Ba)O-MgO-Ta_2O_5$ (in Sample No. 23) and $(Ba-Ca-Sr)O-MgO-Ta_2O_5$ (in Sample No. 24) were respectively obtained in the second calcination, Targets were prepared in the same way as in Example 1 except the compositions were different, and film capacitors of Sample No. 19 to Sample No. 24 were respectively prepared. The results from the same evaluations as in Example 1 were shown in Table 2.

TABLE 2

| | Sample No. | AO | | | BO | $C_2O_5$ | | Relative permittivity (—) | Q value (—) | TCC (ppm/K) |
|---|---|---|---|---|---|---|---|---|---|---|
| | | Ba | Ca | Sr | Mg | Nb | Ta | | | |
| | | x | | | y | z | | | | |
| Example 1 | 9 | 0.308 | 0.000 | 0.000 | 0.534 | 0.000 | 0.158 | 23 | 723 | +33 |
| Example 2 | 19 | 0.000 | 0.308 | 0.000 | 0.534 | 0.000 | 0.158 | 20 | 739 | +21 |
| | 20 | 0.000 | 0.000 | 0.308 | 0.534 | 0.000 | 0.158 | 21 | 703 | +27 |
| | 21 | 0.154 | 0.154 | 0.000 | 0.534 | 0.000 | 0.158 | 20 | 715 | +33 |
| | 22 | 0.000 | 0.154 | 0.154 | 0.534 | 0.000 | 0.158 | 20 | 722 | +27 |
| | 23 | 0.154 | 0.000 | 0.154 | 0.534 | 0.000 | 0.158 | 22 | 701 | +30 |
| | 24 | 0.103 | 0.103 | 0.103 | 0.534 | 0.000 | 0.158 | 20 | 702 | +27 |

Sample No. 9, Sample No. 19 to Sample No. 24

Similar to the sample shown in FIG. 2, no defect such as crack was found on the surface in Sample No. 19 to Sample No. 24, According to Table 2, Sample No. 9 and Sample No. 19 to Sample No. 24 exhibited almost the same properties, wherein, these samples were dielectric compositions with $AO-MgO-Ta_2O_5$ as the main component and A contained at least one element selected from the group consisting of Ba, Ca and Sr. Besides, it was confirmed that Sample No. 9 and Sample No. 19 to Sample No. 24 had a relative permittivity of 20 or more, a Q value of 600 or more and a temperature coefficient of static capacity of −60 ppm/K to +60 ppm/K.

Example 3

$BaCO_3$, MgO, $Ta_2O_5$ and $Nb_2O_5$ were weighed to obtain the amounts of Ba, Mg, Ta and Nb as listed in Table 3. Calcined powders of $MgO-Nb_2O_5$ (in Sample No. 25), and $MgO-(Ta-Nb)_2O_5$ (in Sample No. 26) were obtained in the first calcination respectively. And Calcined powders of $BaO-MgO-Nb_2O_5$ (in Sample No. 25), and $BaO-MgO-(Ta-Nb)_2O_5$ (in Sample No. 26) were obtained in the second calcination respectively. Targets were prepared in the same way as in Example 1 except that the compositions were different, and film capacitor samples of Sample No. 25 and Sample No. 26 were respectively prepared. The results from the same evaluations as in Example 1 were shown in Table 3.

TABLE 3

| | Sample No. | AO | | | BO | $C_2O_5$ | | Relative permittivity (—) | Q value (—) | TCC (ppm/K) |
|---|---|---|---|---|---|---|---|---|---|---|
| | | Ba | Ca | Sr | Mg | Nb | Ta | | | |
| | | x | | | y | z | | | | |
| Example 1 | 9 | 0.308 | 0.000 | 0.000 | 0.534 | 0.000 | 0.158 | 23 | 723 | +33 |
| Example 3 | 25 | 0.308 | 0.000 | 0.000 | 0.534 | 0.158 | 0.000 | 20 | 713 | +30 |
| | 26 | 0.308 | 0.000 | 0.000 | 0.534 | 0.079 | 0.079 | 21 | 717 | +31 |

Sample No. 9, Sample No. 25 and Sample No. 26

Similar to the sample shown in FIG. 2, no defect such as crack was found on the surface in Sample No. 25 and Sample No. 26. According to Table 3, it was confirmed that Sample No. 9, Sample No. 25 and Sample No. 26 exhibited almost the same properties wherein these samples were dielectric compositions with BaO—MgO—$C_2O_5$ as the main component and C contained at least one element selected from the group consisting of Nb and Ta, Besides, it was confirmed that Sample No. 9, Sample No. 25 and Sample No. 26 had a relative permittivity of 20 or more, a Q value of 600 or more and a temperature coefficient of static capacity of −60 ppm/K to +60 ppm/K.

Example 4

$BaCO_3$, $CaCO_3$, $SrCO_3$, MgO, $Ta_2O_5$ and $Nb_2O_5$ were weighed to obtain the amounts of Ba, Ca, Sr, Mg, Ta and Nb listed in Table 4. Calcined powders of MgO—(Ta—Nb)$_2O_5$ (in Sample No. 27 to Sample No. 30) were obtained in the first calcination. Calcined powders of (Ba—Ca)O—MgO—(Ta—Nb)$_2O_5$ (in Sample No. 27), (Ca—Sr)O—MgO—(Ta—Nb)$_2O_5$ (in Sample No. 28), (Sr—Ba)O—MgO—(Ta—Nb)$_2O_5$ (in Sample No. 29) and (Ba—Ca—Sr)O—MgO—(Ta—Nb)$_2O_5$ (in Sample No. 30) were obtained in the second calcination respectively. Targets were prepared in the same way as in Example 1 except the compositions were different, and film capacitors of Sample No. 27 to Sample No. 30 were respectively prepared. The results from the same evaluations as in Example 1 were shown in Table 4.

TABLE 4

| | Sample No. | A | | | B | C | | Relative permittivity (—) | Q value (—) | TCC (ppm/K) |
|---|---|---|---|---|---|---|---|---|---|---|
| | | Ba | Ca | Sr | Mg | Nb | Ta | | | |
| | | x | | | y | z | | | | |
| Example 1 | 9 | 0.308 | 0.000 | 0.000 | 0.534 | 0.000 | 0.158 | 23 | 723 | +33 |
| Example 4 | 27 | 0.154 | 0.154 | 0.000 | 0.534 | 0.079 | 0.079 | 20 | 722 | +32 |
| | 28 | 0.000 | 0.154 | 0.154 | 0.534 | 0.079 | 0.079 | 20 | 714 | +29 |
| | 29 | 0.154 | 0.000 | 0.154 | 0.534 | 0.079 | 0.079 | 22 | 716 | +31 |
| | 30 | 0.103 | 0.103 | 0.103 | 0.534 | 0.079 | 0.079 | 21 | 717 | +29 |

Sample No. 27 to Sample No. 30

Similar to the sample shown in FIG. 2, no defect such as crack was found on the surface in Sample No. 27 to Sample No. 30. According to Table 4, it was confirmed that Sample No. 27 to Sample No. 30 exhibited almost the same properties wherein these samples were dielectric compositions with AO—BO—$C_2O_5$ as the main component and A contained at least one element selected from the group consisting of Ba, Ca and Sr, B was Mg, and C contained at least one element selected from the group consisting of Nb and Ta. Besides, it was confirmed that Sample No. 27 to Sample No. 30 had a relative permittivity of 20 or more, a Q value of 600 or more and a temperature coefficient of static capacity of −60 ppm/K to +60 ppm/K.

Example 5

The sample was prepared by the same method as that of Sample No. 9 in Example 1 except that the dielectric film was deposited by the sputtering method, Besides, the evaluations were performed in the same way as in Example 1, The obtained results were shown in Table 5.

Example 6

The sample was prepared by the same method as that of Sample No. 9 in Example 1 except that the dielectric film had a thickness of 800 nm. Besides, the evaluations were performed in the same way as in Example 1. The obtained results were shown in Table 5.

TABLE 5

| | Sample No. | AO | | | BO | $C_2O_5$ | | Relative permittivity (—) | Q value (—) | TCC (ppm/K) | |
| | | Ba | Ca | Sr | Mg | Nb | Ta | | | | |
| | | | x | | y | z | | | | | |
|---|---|---|---|---|---|---|---|---|---|---|---|
| Example 1 | 9 | 0.308 | 0.000 | 0.000 | 0.534 | 0.000 | 0.158 | 23 | 723 | +33 | PLD/ 400 nm |
| Example 5 | 31 | 0.308 | 0.000 | 0.000 | 0.534 | 0.000 | 0.158 | 22 | 726 | +32 | Sputtering/ 400 nm |
| Example 6 | 32 | 0.308 | 0.000 | 0.000 | 0.534 | 0.000 | 0.158 | 22 | 731 | +33 | PLD/ 800 nm |

Sample No. 31 and Sample No. 32

Similar to the sample shown in FIG. 2, no defect such as crack was found on the surface in Sample No. 31 and Sample No. 32. According to Table 5, it was confirmed that the relative permittivity was 20 or more, the Q value was 600 or more and the temperature coefficient of static capacity fell within the range of −60 ppm/K to +60 ppm/K when the dielectric film of the present embodiment was used even if the dielectric film was prepared by a different method (Sample No. 31) or the dielectric film had a different thickness (Sample No. 32).

As described above, the present invention relates to a dielectric composition and an electronic component. In particular, the present invention provides a dielectric composition and an electronic component using this dielectric composition, in which the dielectric composition and the electronic component have a high relative permittivity, a low dielectric loss (i.e., a high Q value), and a small temperature coefficient of static capacity even when they are downsized. In this respect, the electronic component using the dielectric composition can be downsized and provided with excellent functions. The present invention widely provides novel technologies to a film component working at a high frequency which uses dielectric films such as a diplexer or a band-pass filter.

DESCRIPTION OF REFERENCE NUMERALS

1 Supporting substrate
2 Foundation layer
3 Lower electrode
4 Upper electrode
5 Dielectric film
10 Film capacitor

What is claimed is:

1. A dielectric composition characterized in comprising a complex oxide represented by a formula of $xAO\text{-}yBO\text{-}zC_2O_5$ as the main component, wherein,
    A represents at least one element selected from the group consisting of Ba, Ca and Sr,
    B represents Mg,
    C represents at least one element selected from the group consisting of Nb and Ta, and x, y and z meet the following conditions,
    $x+y+z=1.000$,
    $0.198 \leq x \leq 0.375$,
    $0.389 \leq y \leq 0.625$, and
    $x/3 \leq z \leq x/3+1/9$.

2. The dielectric composition of claim 1 characterized in comprising
    a complex oxide represented by the formula in which x, y and z meet the following conditions as the main component,
    $x+y+z=1.000$,
    $0.240 \leq x \leq 0.328$,
    $0.534 \leq y \leq 0.625$, and
    $0.094 \leq z \leq 0.158$.

3. An electronic component comprising the dielectric composition of claim 1.

4. An electronic component comprising the dielectric composition of claim 2.

* * * * *